United States Patent [19]

Thommen

[11] Patent Number: 4,963,840
[45] Date of Patent: Oct. 16, 1990

[54] DELAY-CONTROLLED RELAXATION OSCILLATOR WITH REDUCED POWER CONSUMPTION

[75] Inventor: Werner F. Thommen, Staefa, Switzerland

[73] Assignee: U.S. Philips Corporation, New York, N.Y.

[21] Appl. No.: 433,065

[22] Filed: Nov. 6, 1989

[30] Foreign Application Priority Data

Nov. 7, 1988 [NL] Netherlands ............ 8802719

[51] Int. Cl.$^5$ .................... H03K 3/02
[52] U.S. Cl. .................... 331/111; 331/143
[58] Field of Search ........ 331/111, 143, DIG. 3

[56] References Cited

U.S. PATENT DOCUMENTS

| 4,191,932 | 3/1980 | Nagahama | 331/111 |
| 4,472,688 | 9/1984 | Saburo et al. | 330/297 |
| 4,644,300 | 2/1987 | Ibe et al. | 331/111 |
| 4,675,617 | 6/1987 | Martin | 331/1 A |

Primary Examiner—David Mis
Attorney, Agent, or Firm—Bernard Franzblau

[57] ABSTRACT

A delay-controlled relaxation oscillator includes a capacitance in the oscillator which is alternately charged and discharged. The change-over from charging to discharging is controlled by means of a comparator which compares the capacitance voltage with a reference voltage. The oscillator also includes switching means for reducing the power consumed by switching the power supply for the comparator from the power supply mode into a stand-by mode between two change-overs.

11 Claims, 2 Drawing Sheets

DELAY-CONTROLLED RELAXATION OSCILLATOR WITH REDUCED POWER CONSUMPTION

The invention relates to an oscillator including:
a capacitance;
a charging means for charging the capacitance;
a discharging means for discharging the capacitance;
a control comparator for comparing a capacitance voltage, representative of a degree of charge at the capacitance, with a reference voltage;
a monostable multivibrator means having a control input coupled with a control comparator output for activating the discharge means for a predetermined time interval.

An oscillator of this kind is known from the European Patent Application EP-A-147 810. In order to enable fast switching, the gain of said control comparator should be high. Consequently, the control comparator has a correspondingly high power consumption. However, the control comparator is indispensible only during a time interval around a change-over from charging to discharging of the capacitive and a change-over from discharging to charging of the capacitance. Outside these intervals the monostable multivibrator means ensures that the discharging means remains in the desired conductive or blocked state.

It is therefore an object of the invention to provide an oscillator of the afore-mentioned type having a reduced power consumption with regard to the prior art oscillator.

An oscillator according to the invention is therefore characterized in that the oscillator further includes switching means for switching a power supply for the control comparator into a stand-by mode at least after a change-over from charging to discharging of the capacitance or after a change-over from discharging to charging, and into an operating mode at least before a change-over from discharging to charging, or before a change-over from charging to discharging, respectively. The switching between a stand-by mode (low power) and an operating mode (high power), for instance under control of the oscillator signal itself, enables a simple way of reducing power consumption.

In an embodiment of an oscillator in accordance with the invention characterized in that the control comparator includes a transistor differential-pair being fed by a parallel arrangement of a constant current source and a controllable current source that is controlled by the switching means. In the stand-by mode the controllable current source remains turned off and in the operating mode the controllable current source remains turned on. The controllable current source and the constant current source together may comprise a parallel arrangement of conduction channels of two transistors that have their conduction channels coupled with a common node of the transistor differential pair.

The switching means may comprise
a switching means comparator for comparing the capacitance voltage with a second reference voltage differing from said reference voltage, referred to hereinafter as first reference voltage.
The values of the reference voltages determine the moment at which the switching between the modes occurs.

A further embodiment of an oscillator according to the invention is characterized in that the monostable multivibrator means comprises:
a set-reset flip-flop means having a set input coupled with the control comparator output;
a further control comparator for comparing a further voltage, associated with a delayed version of said capacitance voltage, with the reference voltage, having a further control comparator output coupled with a reset input of said flip-flop means, while the switching means controls a power supply for both the control comparator and the further control comparator.

By using a further control comparator in addition to the first-mentioned control comparator the set-reset flip-flop is controlled by control signals that have accurately defined transitions. Both control comparators are powered through the switching means.

A further embodiment of an oscillator in accordance with the invention is characterized in that the switching means comprises:
a switching means comparator for comparing the capacitance voltage with a second reference voltage differing from said reference voltage, referred to hereinafter as the first reference voltage;
a further set-reset flip-flop means having a set input coupled to a switching means comparator output and having a reset input coupled with the reset input of the first-mentioned set-reset flip-flop, a further flip-flop output thereof controlling the power supply for both the control comparator and the further control comparator. Preferably, the switching means comparator is small as compared with the control comparators for the switching time of the switching means comparator has no effect on the duration of the oscillation period.

Thus, oscillators are realised which have an accurately defined oscillation period and a low power consumption.

The invention will be described in detail hereinafter with reference to a drawing; therein.

Figure 1:
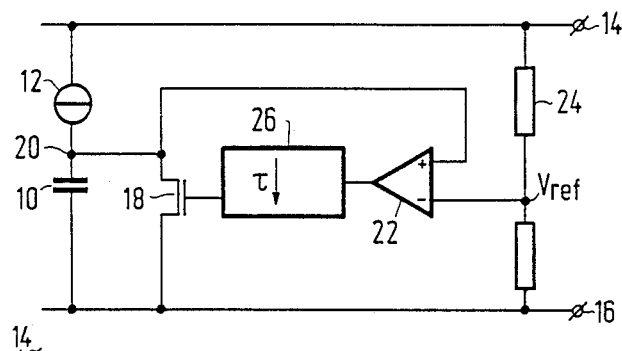
FIG. 1 shows the circuit diagram of a known oscillator.

FIG. 1 shows the circuit diagram of a known oscillator. The oscillator shown comprises a series connection of a capacitance 10 and a current source 12 between power supply terminals 14 and 16. A current channel of a transistor 18 is connected parallel across the capacitance 10. The node 20 between the capacitance 10 and the current source 12 is connected to a non-inverting input of a comparator 22, an inverting input of which is connected to a voltage divider 24 for supplying a reference voltage $V_{ref}$. A control electrode of the transistor 18 is connected to the comparator output via delay means 26. The delay means 26 turn off the transistor 18 a predetermined period of time after the transistor has been turned on. Due to the current applied to the capacitance the voltage on the node 20 increases until it reaches a value which is substantially equal to the reference voltage. At that instant the voltage on the comparator output changes from low to high and the transistor 18 is turned on, with the result that the capacitance 10 is discharged. The delay means ensure that the transistor 18 remains turned on for a predetermined period of time in order to ensure that the voltage on the node 20 decreases sufficiently, for example to one per thousand of the maximum capacitance voltage. When the transistor 18 is subsequently turned off again, the voltage on the node 20 can increase again until the next discharge occurs. It is to be noted that, even though the symbol of a current source is used in FIG. 1, it is to be understood to include also a resistance. It is also to be noted that, for example a further resistance can be inserted in the discharging path in order to impart a less steep negative-going edge to a sawtooth voltage across the capacitance 10.

Figure 2A:
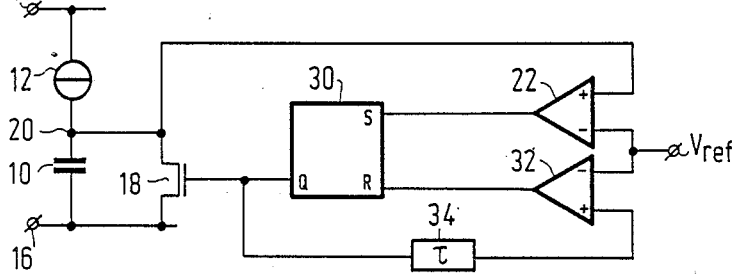
FIGS. 2A, 2B and 2C show embodiments of an oscillator realized in accordance with an asepct of the invention.
Figure 2B:
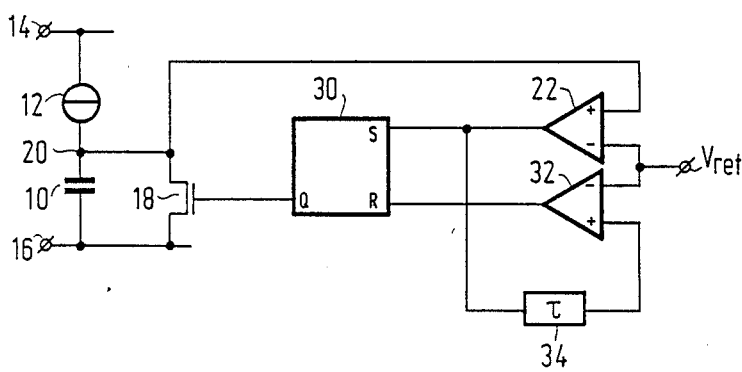
Figure 2C:
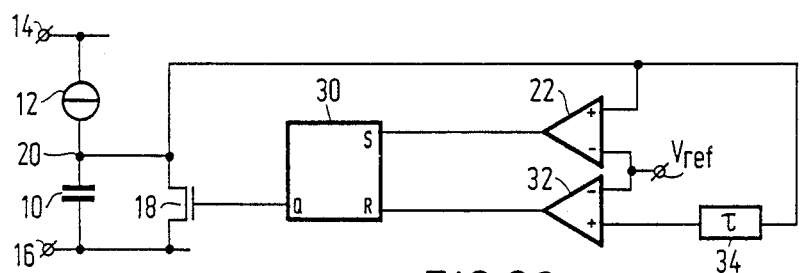

FIGS. 2A, 2B and 2C show embodiments of an oscillator in accordance with an aspect of the invention. The components which correspond to components shown in FIG. 1 are denoted by the same reference numerals.

In FIG. 2A the delay means comprise an RS flip-flop 30, a second comparator 32 and a delay element 34. The output of the first comparator 22 is connected to the set input of the flip-flop 30. The second comparator 32 comprises an output which is coupled to the reset input of the flip-flop 30. The inverting inputs of the comparators 22 and 32 are connected to one another and to a reference voltage $V_{ref}$. The non-inverting input of the comparator 32 is coupled, via the delay element 34, to the non-inverting output of the flip-flop 30. The delay element 34 comprises, for example a temperature-stabilized combination of a resistance and a further capacitance, the latter capacitance connecting the non-inverting input of the comparator 32 to the power supply terminal 16. Alternatively, the delay element 34 comprises, for example a number of cascade-connected inverters. Another possibility consists in that the delay element 34 comprises a semiconductor delay line, a square root of the resistance and capacitance thereof defining the delay. Preferably, the delay element 34 has a low temperature sensitivity.

The operation of the circuit is as follows. As soon as the capacitance voltage on the node 20 exceeds the reference voltage $V_{ref}$, the flip-flop 30 is set by the comparator 22 so that the flip-flop output turns on the transistor 18 by way of a high signal. Subsequently, the voltage on the node 20 decreases. The comparator 22 then applies a low signal to the set input. The output voltage of the flip-flop 30 does not change in response thereto. The output voltage is applied, via the delay element 34, to the comparator 32 which supplies the reset input of the flip-flop 30 with a high signal after a predetermined period of time. Subsequently, the flip-flop 30 is reset and the transistor 18 is turned off by means of a low output signal of the flip-flop. The circuits shown in the FIGS. 2B and 2C deviate from the circuit shown in FIG. 2A merely in that the signal is applied to the second comparator 32 in a delayed fashion or originates from the output of the comparator 22 and from the node 20. Provided that this signal has the correct polarity and is indicative of the voltage on the node 20, either directly or indirectly, the latter two circuits operate in the same way as the circuit shown in FIG. 2A. However, it may be that the use of an as small as possible delay element 34 is to be preferred. Therefore, it is advantageous to utilize the inherent switching delay of the flip-flop 30 and to connect the delay element 34 to the output of the flip-flop 30.

FIG. 2 utilizes two comparators in order to ensure that the flip-flop 30 is controlled by means of well-defined control signals. This benefits the accuracy of the oscillation period.

Figure 3A:
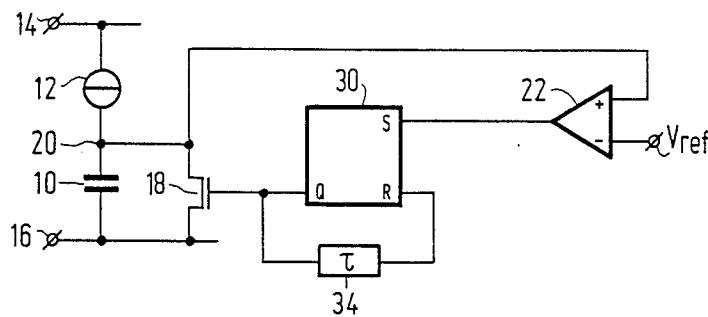
FIGS. 3A, 3B and 3C show embodiments of an oscillator in accordance with the principle shown in FIG. 1.
Figure 3B:
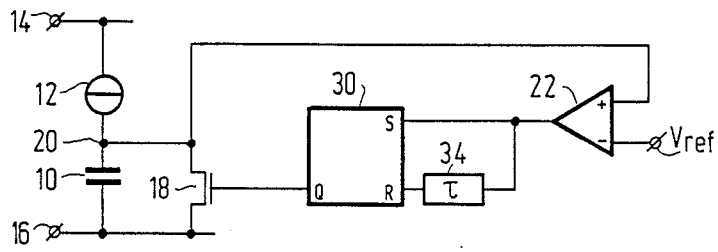
Figure 3C:
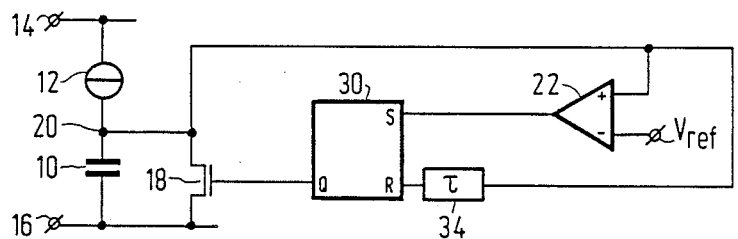

The FIGS. 3A, 3B and 3C show embodiments of an oscillator in accordance with the principle of FIG. 1. Components which correspond to components of the circuits shown in the preceding Figures are denoted by the same reference numerals.

The circuits shown in the FIGS. 3A, 3B and 3C require only a single comparator 22. The reset input of the flip-flop 30 is now fed directly via the delay element 34. In practice delay elements are often frequency-selective, so that a sharp transition of a signal applied to such a delay element 34 is distorted. This could introduce some inaccuracy as regards the instant of switching of the flip-flop 30. By the addition of an additional comparator as in the FIGS. 2A, 2B and 2C, this problem can be mitigated. However, this has the drawback that the current consumption is higher and that the dimensions of the circuit are larger. The circuits shown in the FIGS. 3A, 3B and 3C deviate from one another in the same way as the circuits shown in the FIGS. 2A, 2B and 2C, i.e. in that the signal applied to the flip-flop 30 via the delay element 34 is derived from different points in the circuit.

Figure 4:
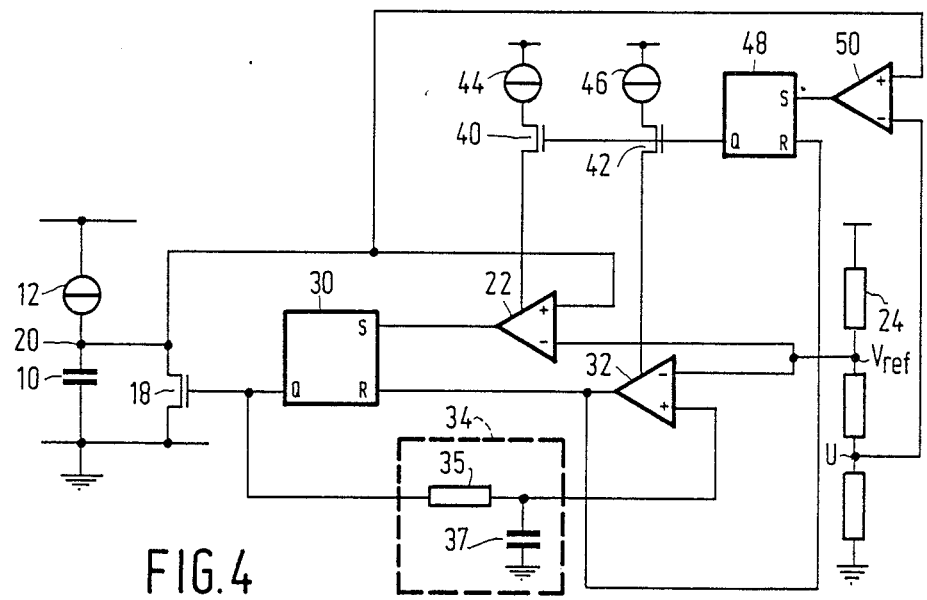
FIG. 4 shows a preferred embodiment of an oscillator in accordance with the invention.

FIG. 4 shows a preferred embodiment of an oscillator in accordance with the invention. Components which correspond to components of the preceding Figures are denoted by the same reference numerals. The delay element 34 is constructed as an RC combination comprising a resistance 35 and a capacitance 37. Comparators 22 and 32 are connected, via switches 40 and 42, to a power supply source which is in this case represented by the current sources 44 and 46. For as long as these switches are blocked, the comparators are connected to a stand-by power supply (not shown). To this end, each of the comparators 22 and 32 comprises, for example a differential amplifier of a long-tailed pair type which is powered by a stand-by current source in the tail. As soon as the switches 40 and 42 are conductive, a power supply source is connected parallel to the stand-by current source so that the currents in the differential amplifier increase. The switches 40 and 42 are coupled to an output of a flip-flop 48, a set input of which is connected to an output of the comparator 50 and a reset input of which is coupled to the output of the comparator 32. An inverting input of the comparator 50 receives a reference voltage U which is lower than the reference voltage $V_{ref}$. The non-inverting input of the comparator 50 is connected to the node 20 which carries the capacitance voltage. Before the capacitance voltage equals the reference voltage U, the switches 40 and 42 are blocked. At the instant at which the capacitance voltage exceeds the reference voltage U, the power supply source 44 and 46 are connected to the comparators 22 and 32. The capacitance voltage subsequently increases until it reaches the level $V_{ref}$. As has already been described, the capacitance 10 is subsequently discharged via the transistor 18 which remains turned on until the comparator 32 resets the flip-flop 30 by way of a high signal. At that instant the flip-flop 48 is also reset, so that the power supply is switched off. Thus, the comparators 22 and 32 dissipate power only when the transistor 18 switches.

What is claimed is:
1. An oscillator comprising:
a capacitance;
a means for charging the capacitance;
a means for discharging the capacitance;

a control comparator for comparing a capacitance voltage, representative of a degree of charge on the capacitance, with a reference voltage;

a monostable multivibrator means having a control input coupled to an output of the control comparator for activating the discharging means for a predetermined time interval;

and switching means for switching a power supply for the control comparator into a stand-by mode at least after a change-over from charging to discharging of the capacitance or after a change-over from discharging to charging, and into an operating mode at least before a change-over from discharging to charging, or before a change-over from charging to discharging, respectively.

2. An oscillator as claimed in claim 1, wherein the control comparator includes a transistor differential-pair fed by a parallel arrangement of a constant current source and a controllable current source that is controlled by the switching means.

3. An oscillator as claimed in claim 2, wherein the switching means comprises:
a switching means comparator for comparing the capacitance voltage with a second reference voltage differing from said first reference voltage.

4. An oscillator as claimed in claim 1, wherein the monostable multivibrator means comprises:
a set-reset flip-flop having a set input coupled to an output of the control comparator;
a further control comparator for comparing a further voltage, associated with a delayed version of said capacitance voltage, with the reference voltage, means coupling an output of the further control comparator to a reset input of said flip-flop, and the switching means controls a power supply for both the control comparator and the further control comparator.

5. An oscillator as claimed in claim 4, wherein a delay element is connected in one of the following paths:
a first path between a flip-flop output and an input of the further control comparator;
a second path between the control comparator output and the further control comparator input;
a third path between a control comparator input and the further control comparator input.

6. An oscillator as claimed in claim 4, wherein the switching means comprises:
a switching means comparator for comparing the capacitance voltage with a second reference voltage differing from said first reference voltage,
a further set-reset flip-flop having a set input coupled to a switching means comparator output and having a reset input coupled to the reset input of the first set-reset flip-flop, a further flip-flop output thereof controlling the power supply for both the control comparator and the further control comparator.

7. An oscillator as claimed in claim 4, wherein the switching means comparator is substantially smaller than each of said control comparators.

8. An oscillator as claimed in claim 1, wherein the switching means comprises:
a switching means comparator for comparing the capacitance voltage with a second reference voltage differing from said first reference voltage.

9. An oscillator as claimed in claim 2, wherein the monostable multivibrator means comprises:
a set-reset flip-flop having a set input coupled to an output of the control comparator;
a further control comparator for comparing a further voltage, associated with a delayed version of said capacitance voltage, with the reference voltage, means coupling an output of the further control comparator to a reset input of said flip-flop, and the switching means controls a power supply for both the control comparator and the further control comparator.

10. An oscillator as claimed in claim 9, wherein a delay element is connected in one of the following paths:
a first path between a flip-flop output and an input of the further control comparator;
a second path between the control comparator output and the further control comparator input;
a third path between a control comparator input and the further control comparator input.

11. An oscillator comprising:
a capacitance;
a means for charging the capacitance;
a means for discharging the capacitance;
a control comparator for comparing a capacitance voltage, representative of a degree of charge on the capacitance, with a reference voltage;
a monostable multivibrator means having a control input coupled to an output of the control comparator for activating the discharging means for a predetermined time interval; wherein the monostable multivibrator means includes:
a set-reset flip-flop having a set input coupled to the control comparator output;
a further control comparator for comparing a further voltage, associated with a delayed version of said capacitance voltage, with the reference voltage, and means coupling an output of the further control comparator to a reset input of said flip-flop.

* * * * *